United States Patent [19]

Schunck

[11] Patent Number: 5,739,214
[45] Date of Patent: Apr. 14, 1998

[54] RADIATION-CURABLE COATING OF UNSATURATED PREPOLYMER, EPOXY AND KETONE RESIN

[75] Inventor: Stephan Schunck, Augsburg, Germany

[73] Assignee: BASF Lacke + Farben, AG, Muenster-Hiltrup, Germany

[21] Appl. No.: 666,441

[22] PCT Filed: Nov. 28, 1994

[86] PCT No.: PCT/EP94/03940

§ 371 Date: Jun. 21, 1996

§ 102(e) Date: Jun. 21, 1996

[87] PCT Pub. No.: WO95/17476

PCT Pub. Date: Jun. 29, 1995

[30] Foreign Application Priority Data

Dec. 23, 1993 [DE] Germany .............. 43 44 125.4

[51] Int. Cl.$^6$ .............. C08L 63/02; C08L 63/04; C08L 67/06; C08L 61/02
[52] U.S. Cl. .............. 525/438; 525/65; 525/110; 525/118; 525/454; 525/471; 525/522; 427/519; 428/412
[58] Field of Search .............. 525/438, 454, 525/531, 532, 471, 522, 65, 110, 118; 427/519

[56] References Cited

U.S. PATENT DOCUMENTS

| 4,156,035 | 5/1979 | Tsao et al. | 427/44 |
|---|---|---|---|
| 4,205,018 | 5/1980 | Nagasawa et al. | 525/404 |
| 4,295,947 | 10/1981 | Ohtani et al. | 522/103 |
| 4,426,431 | 1/1984 | Harasta et al. | 522/15 |
| 4,428,807 | 1/1984 | Lee et al. | 204/159.14 |
| 4,514,439 | 4/1985 | Rounds | 427/54.1 |
| 4,657,779 | 4/1987 | Gaske | 427/54.1 |
| 5,093,386 | 3/1992 | Bishop et al. | 522/103 |

FOREIGN PATENT DOCUMENTS

A0 393 407  10/1990  European Pat. Off. .

Primary Examiner—Robert E. Sellers

[57] ABSTRACT

The present invention relates to radiation-curable coating compositions comprising (A) from 20 to 50% by weight of at least one prepolymer containing at least two ethylenically unsaturated double bonds, (B) from 20 to 60% by weight of at least one cationically curing epoxy resin, (C) from 10 to 30% by weight of at least one ketonic and/or ketone-formaldehyde resin, (D) from 5 to 40% by weight of at least one reactive diluent, and (E) from 5 to 10% by weight of a mixture of at least one cationic polymerization initiator and at least one free-radical polymerization initiator, the sum of the proportions by weight of components A to E being in each case 100% by weight.

11 Claims, No Drawings

RADIATION-CURABLE COATING OF UNSATURATED PREPOLYMER, EPOXY AND KETONE RESIN

FIELD OF THE INVENTION

The present invention relates to a radiation-curable coating composition comprising at least one cationically curing epoxy resin, at least one free-radically curing, ethylenically unsaturated compound, and photoinitiators.

The invention also relates to a method of coating metallized surfaces and to the use of the radiation-curable coating compositions for the coating of metallized surfaces such as, for example, of data carriers, and in particular to their use for the coating of the metallized side of compact disks.

BACKGROUND AND SUMMARY OF THE INVENTION

Compact disks are pressed from high-purity polycarbonate under the action of pressure and heat. The side carrying the data is then vapor-coated with a reflecting layer of aluminum. This aluminum layer is only about 7 to $8 \times 10^{-8}$ m thick and requires protection against damage by external influences and against corrosion, in order to ensure error-free sampling of the stored data. The metallized layer is therefore usually provided with a clear protective coat which is then in turn provided with a label, printed in one or more colors with a conventional printing ink.

In many cases conventional, i.e., solvent-containing, coating materials are still used to produce the protective layer. High-volume production and the increasingly stringent statutory regulations on industrial coating plants with the aim of limiting the emission of pollutants are leading, however, to the increasing use of more environmentally friendly, solvent-free coating materials.

One alternative is to coat the metallized side of compact disks with radiation-curable coating materials. However, a number of specific problems of radiation-curable systems are associated with this technology. For instance, a shrinkage of the film is observed on curing radiation-curable materials because the transition from the liquid to the solid state is extremely rapid, and the polymerization is accompanied by a reduction in volume. On metal surfaces which have not been chemically pretreated this results in serious problems of adhesion. Because of the danger of early corrosion of the aluminum layer, conventional adhesion promoters cannot be used to solve this problem.

There are also problems with regard to the printability of the protective coat with solvent-containing printing inks. This is because radiation-curable coating materials generally lead to coatings of extremely high solvent resistance. This causes the adhesion of the printing ink to protective layers of radiation-curable coating materials to be inadequate. Finally, the inadequate scratch resistance of the cured coatings also causes problems.

U.S. Pat. No. 4,657,779 discloses radiation-curable coating compositions whose shrinkage is so low that they are also suitable for coating deformable substrates such as, for example, polycarbonate compact disks. These radiation-curable coating materials comprise a cationically curable polyepoxide, an acrylate-functional component containing at least one reactive group, an acrylate-functional component to establish the viscosity, and a photoinitiator component. These radiation-curable coating materials known from U.S. Pat. No. 4,657,779 have the disadvantage, however, of inadequate scratch resistance in the cured coatings. In addition, there is no attempt made to address the problem of the printability of the cured protective layers with conventional printing inks.

From EP-B-138 381 it is also known to coat compact disks with radiation-curable coating materials. The examples given in EP-B-138 381 of suitable coating materials are mixtures which comprise a free-radically polymerizable monomer and/or oligomer, a cationically polymerizable compound such as, for example, an epoxy resin, and a photoinitiator. The use of these radiation-curable coating materials also leads to coatings having an inadequate scratch resistance.

The combination of free-radically and cationically curing systems to improve the technical properties of the resulting coatings is also described in other documents, for example in EP-B-119 219 and in U.S. Pat. No. 4,428,807. However, these documents contain no mention of the use of these radiation-curable coating materials for coating metallized surfaces of data carriers. Furthermore, these systems, too, exhibit only an inadequate scratch resistance in the resulting coatings.

The object of the present invention is, therefore, to provide radiation-curable coating compositions which lead to coatings having a good adhesion to metallized surfaces, high scratch resistance, and good printability with conventional printing inks. In addition, these radiation-curable coating compositions should exhibit minimal shrinkage on curing and should lead to clear, transparent coatings.

Surprisingly, this object is achieved by a radiation-curable coating composition comprising at least one cationically curing epoxy resin, at least one free-radically curing, ethylenically unsaturated compound, and a mixture of at least one cationic polymerization initiator and at least one free-radical polymerization initiator. The coating composition is characterized in that it comprises (A) from 20 to 50% by weight of at least one prepolymer containing at least two ethylenically unsaturated double bonds, (B) from 20 to 60% by weight of at least one cationically curing epoxy resin, (C) from 10 to 30% by weight of at least one ketonic and/or ketone-formaldehyde resin, (D) from 5 to 40% by weight of at least one reactive diluent, and (E) from 5 to 10% by weight of a mixture of at least one cationic polymerization initiator and at least one free-radical polymerization initiator, the sum of the proportions by weight of components A to E being in each case 100% by weight.

The present invention also relates to a method of coating metallized surfaces, in which the coating compositions according to the invention are applied and are cured by means of UV radiation or electron beams. Advantageous embodiments of this method are evident from the subclaims. In addition, the invention relates to the use of the radiation-curable coating compositions for the coating of data-storage devices. Finally, the invention also relates to the data-storage devices coated with the coating composition.

It is surprising and was unforeseeable that the combination of free-radically and cationically curing components with a physically drying component could be used to obtain radiation-curable coating compositions which lead to coatings having a good adhesion to metallized surfaces, a good scratch resistance and a good printability with conventional printing inks. Moreover, the coating compositions according to the invention have the advantage that they exhibit only a low shrinkage on curing and lead to optically transparent coatings.

DETAILED DESCRIPTION

In the text below, the individual components of the radiation-curable coating compositions according to the invention are first described in more detail.

As component A, suitable prepolymers are those containing at least two ethylenically unsaturated double bonds per molecule. A wide variety of resins can be employed as the basic framework. It is preferred for the double bonds to derive from ethylenically unsaturated carboxylic acids, preferably from acrylic or methacrylic acid and particularly preferably from acrylic acid. Suitable examples of component A are polyester acrylates, epoxy acrylates, urethane acrylates, or acrylate copolymers which contain acryloyl groups. The urethane acrylates which can be employed as component A are known and are described in, for example, EP-B-167 199 and EP-B-204 161. They can be obtained by reacting a di- or polyisocyanate with a chain extender from the group of the diols/polyols and/or diamines/polyamines and/or dithiols/polythiols and/or alkanolamines, followed by reaction of the remaining free isocyanate groups with at least one hydroxyalkyl acrylate or hydroxyalkyl ester of other ethylenically unsaturated carboxylic acids.

In this context, the quantities of chain extender, di- or polyisocyanate, and hydroxyalkyl ester of an ethylenically unsaturated carboxylic acid are chosen such that 1.) the ratio of equivalents of the NCO groups to the reactive groups of the chain extender (hydroxyl, amino, and/or mercapto groups) is between 3:1 and 1:2, preferably 2:1, and 2.) the OH groups of the hydroxyalkyl esters of the ethylenically unsaturated carboxylic acids are present in a stoichiometric quantity in relation to the remaining free isocyanate groups of the prepolymer of isocyanate and chain extender.

It is also possible to prepare the polyurethane acrylates A by first reacting some of the isocyanate groups of a di- or polyisocyanate with at least one hydroxyalkyl ester of an ethylenically unsaturated carboxylic acid and then reacting the remaining isocyanate groups with a chain extender. In this case too the quantities of chain extender, isocyanate and hydroxyalkyl ester of unsaturated carboxylic acids are chosen such that the ratio of equivalents of the NCO groups to the reactive groups of the chain extender is between 3:1 and 1:2, preferably 2:1, and the ratio of equivalents of the remaining NCO groups to the OH groups of the hydroxyalkyl ester is 1:1.

All of the intermediate forms of these two methods are of course also possible. For example, some of the isocyanate groups of a diisocyanate can be reacted first with a diol, and then some more of the isocyanate groups can be reacted with the hydroxyalkyl ester of an ethylenically unsaturated carboxylic acid, after which the remaining isocyanate groups can be reacted with a diamine.

These various methods of preparing the polyurethane acrylates are known (cf. for example EP-A-204 161) and therefore do not require more detailed description.

The epoxy acrylates which are suitable as component A are likewise known and commercially available. They can be obtained by addition reaction of acrylic acid onto epoxy resins, for example onto epoxy resins based on bisphenol A or other commercially available epoxy resins.

It is also possible to employ as component A ethylenically unsaturated acrylate copolymers which preferably contain acryloxy groups. These unsaturated copolymers can be obtained by reacting a copolymer which has functional groups such as, for example, hydroxyl, carboxyl, amino, thiol, epoxide, or isocyanate groups, with compounds which have at least one ethylenically unsaturated double bond and a group which is reactive toward the functional groups of the copolymer. Suitable ethylenically unsaturated acrylate copolymers can be obtained, for example, by addition of an ethylenically unsaturated isocyanate or of an anhydride of an ethylenically unsaturated carboxylic acid or of an ethylenically unsaturated carboxylic acid or of an equimolar addition product of an ethylenically unsaturated hydroxyl-containing compound and of a diisocyanate compound onto a hydroxyl-containing acrylate resin.

Suitable ethylenically unsaturated acrylate copolymers can also be obtained, for example, by reacting a carboxyl-containing acrylate resin with ethylenically unsaturated compounds having a group reactive toward carboxyl groups. Suitable ethylenically unsaturated compounds of this type are, for example, hydroxyalkyl esters of ethylenically unsaturated carboxylic acids, or epoxide-containing ethylenically unsaturated compounds such as, for example, glycidyl (meth)acrylate.

Furthermore, epoxide-containing acrylate resins can also be reacted with ethylenically unsaturated compounds which contain a group which is reactive toward epoxide groups, for example ethylenically unsaturated carboxylic acids.

Preferably, component A is selected from acrylic-modified polyesters. These polyesters can be prepared by a variety of methods. For example, acrylic acid or another ethylenically unsaturated carboxylic acid can be employed directly as an acid component when synthesizing the polyesters. It is also possible to employ hydroxyalkyl esters of (meth)acrylic acid or of other ethylenically unsaturated carboxylic acids directly as the alcohol component when synthesizing the polyesters. The acrylic-modified polyesters are preferably prepared, however, by "acrylicization" of polyesters. For example, hydroxyl-containing polyesters can first be synthesized, which are then reacted with acrylic or methacrylic acid. It is also possible first to synthesize carboxyl-containing polyesters which are then reacted with a hydroxyalkyl ester of acrylic or methacrylic acid. Unreacted (meth)acrylic acid can be removed from the reaction mixture by being washed out or distilled or, preferably, by reaction with an equivalent quantity of a mono- or diepoxide compound using suitable catalysts, for example triphenylphosphine. For further details on the preparation of the polyester acrylates which are suitable as component A, reference is made in particular to DE-A 33 16 593 and DE-A 38 36 370, and also to EP-A-54 105, DE-B 20 03 579, and EP-B-2866.

Examples of polyester acrylates which are suitable as component A are the products commercially available under the following trade names: various Laromer® grades from BASF AG, for example Laromer® LR 8799, Laromer® LR 8828, Laromer® LR 8800, Laromer® PE 55F, Laromer® PE 46, and Laromer® PE 55W; Oligomer AS-X 95 and Oligomer AS-X6, both from Hans Rahn & Co., Zurich.

It is also possible to employ as component A mixtures of different prepolymers.

Component A is employed in the coating compositions in a quantity of from 20 to 50% by weight based on the overall weight of the sum of components A to E.

As a further component which is essential to the invention, the radiation-curable coating compositions contain from 20 to 60% by weight, based on the overall weight of the sum of components A to E, of at least one cationically curable epoxy resin (component B).

The cationically curable epoxy resins which are suitable as component B are known. For example, it is possible to employ epoxy resins based on bisphenol A which are marketed, for example, under the trade names Epikote® from Shell, Bakelite® from Union Carbide Corporation, Araldite® from Ciba Geigy, and DER® from Dow Chemical. Epoxy resins of the novolak type can also be employed.

As component B it is preferred to employ cycloaliphatic epoxides such as, for example, 1,2-epoxy-4-(epoxyethyl)cyclohexane, 3,4-epoxycyclohexylmethyl 3,4-epoxycyclohexanecarboxylate, 2-(3,4-epoxycyclohexyl-5,5-spiro-3,4-epoxy)cyclohexane-metha-dioxane and also epoxycyclohexylalkyl dicarboxylates such as, for example, bis(3,4-epoxycyclohexylmethyl) pimelate, bis(3,4-epoxy-6-methylcyclohexylmethyl) maleate, bis-(3,4-epoxy-6-methylcyclohexylmethyl) succinate, bis-(3,4-epoxycyclohexylmethyl) oxalate, bis(3,4-epoxy-6-methylcyclohexylmethyl) sebacate and bis(3,4-epoxy-6-methylcyclohexylmethyl) adipate.

Examples of suitable cycloaliphatic epoxides are the products commercially available under the trade names Bakelite® ERL-4221, Bakelite® ERL-4299, Bakelite® ERL-4206, and Bakelite® ERL-4234 from Union Carbide Corporation; Degacure® K 126 from Degussa AG; and Cyracure® UVR-6100 and Cyracure® UVR-6110 from Union Carbide Corporation.

As a further component essential to the invention, the radiation-curable coating compositions contain as component C from 10 to 30% by weight, based on the overall weight of the sum of components A to E, at least one ketonic resin. Both pure ketonic resins and ketone-formaldehyde resins are suitable as component C. It is preferred to employ ketonic resins. The resins which are suitable as component C preferably have softening points of between 75° and 85° C.

Examples of suitable compounds are the products commercially available under the following names: "Ketonharz A" from BASF AG, a cyclohexanone-formaldehyde resin; "Ketonharz N" from BASF AG, a cyclohexanone resin; Laropal® K 80 and KLR 8804 from BASF AG, condensation products of cyclohexanone.

To establish the viscosity of the coating compositions, the coating compositions also contain from 5 to 40% by weight, based on the overall weight of the sum of components A to E, of at least one reactive diluent (component D).

Suitable as component D are acrylates and methacrylates which are free-radically polymerizable and which contain one or more ethylenically unsaturated groups, vinyl and allyl monomers, vinyl ethers, N-vinyl monomers, epoxidized 1,2-olefins and/or saturated compounds of low viscosity containing at least one group which is reactive toward the functional groups of the binder (component A or B or C). Examples of suitable monomers are ethoxyethoxyethyl acrylate, N-vinylpyrrolidone, phenoxyethyl acrylate, dimethylaminoethyl acrylate, hydroxyethyl acrylate, butoxyethyl acrylate, isobornyl acrylate, dimethylacrylamide, dicyclopentyl acrylate, 2-acetoxyethyl methacrylate, diacetoneacrylamide, butyl acrylate, glycidyl acrylate, glycidyl methacrylate, cyclohexyl acrylate, phenyl acrylate and tert-butyl acrylate. Also suitable are di-, tri- and polyacrylates such as, for example, butanediol diacrylate, trimethylolpropane di- and triacrylate, pentaerythritol di- and triacrylate, glycerol di- and triacrylate, 1,6-hexanediol diacrylate, tetraethylene glycol diacrylate, diethylene glycol diacrylate, diethylene glycol dimethacrylate, ethylene glycol diacrylate, neopentylglycol diacrylate, and trimethylolethane triacrylate. Triacrylate oligomers may also be used, for example, propoxylated glycerol esterified with acrylic acid (34.5 mol % of acrylic acid, 17.5 mol % of glycerol and 48.0 mol % of propanediol) having on average 3 double bonds per molecule, a double-bond equivalent weight of 160 and a number-average molecular weight of 480, which is commercially available under the name "OTA 480" from UCB Chemie GmbH, Drogenbos, Belgium. Another useful oligomer is an alkoxylated tetrafunctional acrylate having a double-bond equivalent weight of 145, which is commercially available under the name "MONIGOMER PPTTA" from Hans Rahn & Co., Zurich.

Other suitable compounds are the long-chain linear diacrylates described in EP-A-250 631 which have a number-average molecular weight from 400 to 4000, preferably from 600 to 2500. The two acrylate groups may, for example, be separated by a polyoxybutylene structure. It is possible, moreover, to employ 1,12-dodecyl diacrylate and the reaction product of 2 moles of acrylic acid with one mole of a dimeric fatty alcohol which in general has 36 C atoms.

Other compounds which are suitable as component D are saturated, low viscosity compounds with at least one group which is reactive toward the functional groups of the binder, examples being alcohols, diols, lactones or other cyclic esters, and also straight-chain diepoxides and the like. These can also be employed in combination with unsaturated monomers and/or oligomers as component D.

Furthermore, the radiation-curable coating compositions according to the invention contain as component E from 5 to 10% by weight, based on the overall weight of the components A to E, of a mixture of photoinitiators, in order to catalyze the free-radical polymerization of components A and D and catalyze the cationic polymerization.

Suitable examples of compounds for initiating the free-radical polymerization are benzoin, benzoin ethers, substituted benzoins, alkyl ethers of substituted benzoins such as, for example, α-methylbenzoin alkyl ethers or α-hydroxymethylbenzoin alkyl ethers; benzils, benzil ketals, for example benzil dimethyl ketal, benzil methyl ethyl ketal, benzil methyl benzyl ketal; ketone-based initiators, for example acetophenone and derivatives thereof, for example diethoxyacetophenone, m-chloroacetophenone, benzophenone and derivatives thereof, for example, 4,4'-dimethylaminobenzophenone, 4,4'-diethylaminobenzophenone, propiophenone, hydroxycyclohexyl phenyl ketone, 2-hydroxy-2-methyl-1-phenylpropan-1-one; anthraquinone and derivatives thereof, and thioxanthone and derivatives thereof, and also mixtures of different initiators.

Suitable photoinitiators for the cationic polymerization are described in detail in U.S. Pat. No. 4,156,035, to which express reference is made here. In accordance with U.S. Pat. No. 4,156,035, therefore, a suitable component D is any onium salt with elements of main group 6, which is capable of forming a Lewis acid on irradiation. Examples of such compounds are triphenylsulfonium fluoroborate and triphenylsulfonium hexafluoroantimonate and other triphenylsulfonium salts. Also suitable are aryldiazonium salts or diaryliodonium salts with various anions such as, for example, tetrafluoroborate, hexafluorophosphate, or hexafluoroarsenate. Metal complexes such as, for example, the ironcyclopentadienealkylbenzene cation with the hexafluorophosphate anion are also suitable.

If desired, the coating compositions according to the invention may also contain conventional auxiliaries and additives in conventional quantities, preferably from 0.05 to 10% by weight based on the overall weight of the coating composition. Examples of such substances are leveling agents and plasticizers.

The radiation-curable coating compositions according to the invention preferably have a very low viscosity, so that they can be applied using a spin coater. The spin coater is in fact the preferred application device, because it is possible using this application method to obtain—without problems—coatings having a smooth surface structure in the desired layer thickness of from 5 to 30 μm. This application method is known.

Therefore, with regard to details of the method, reference is made to the literature.

Of course, the coating compositions according to the invention can also be applied by other known application methods, for example by spraying, roller coating, flow coating, dipping, knife coating or brushing. Furthermore, the coating compositions according to the invention may also be employed in the conventional processes for coating compact disks, as are described, for example, in EP-B-138 381 and in EP-A 72 378.

The coating compositions can be cured by UV radiation or electron beams, preferably by means of UV radiation.

The radiation employed for curing the coating compositions varies depending on the absorption of the photopolymerization initiator. The wavelength of the radiation is usually in the range from 200 to 600 nm. Examples of suitable sources of radiation are carbon arc lamps, mercury vapor lamps, tungsten lamps, argon and xenon discharge lamps, photographic flood lamps and fluorescent tubes containing phosphors which emit ultraviolet light, and also, argon, xenon fluoride and krypton fluoride lasers.

The duration of exposure is generally dependent on the nature of the radiation-sensitive resin employed and on other factors, such as the thickness of the polymer layer applied and the photoinitiator chosen, the nature of the radiation source, and its distance from the film. The particular duration of irradiation can readily be determined by routine experiments. In order that the films can be cured as economically as possible, however, it should be possible to implement curing rates which are as short as possible.

The coating compositions according to the invention are particularly suitable for the coating of metallized surfaces, but can also be applied to other substrates. They are preferably employed for the coating of the metallized side of data-storage devices, in other words as a protective coating for the side which carries the data. In this context, their principal application is the coating of the metallized side of compact disks. In this application, a further advantage for the coating of data-storage devices is the good printability of the protective coatings obtained with conventional printing inks because compact disks, for example, are conventionally printed in one or more colors after having been coated with the protective coating material. One of the critical factors for this application is the good adhesion of the protective coat coupled with good scratch resistance.

The invention is now illustrated in more detail with reference to examples. All parts and percentages in these examples are by weight unless expressly stated otherwise.

EXAMPLE 1

In order to prepare a radiation-curable coating composition 1, the homogenization is carried out first of 10 parts of a commercial cyclohexanone condensation resin (commercial product Laropal® K 80 from BASF AG, form supplied: pellets, softening point according to DIN 53 180, 75°–85° C., acid number according to DIN 53 402, max. 1 mg of KOH/g, iodine color number according to DIN 6162 max. 2), 25 parts of a commercial cycloaliphatic epoxy resin having an epoxy equivalent weight of 130–140 (commercial product CYRACURE® UVR-6100 from Union Carbide Corporation; Brookfield viscosity at 25° C. 85–115 mPas, boiling point 258° C.), 25 parts of a commercial polyester acrylate (commercial product Laromer LR 8828 from BASF AG, Ludwigshafen), 17.5 parts of propoxylated glycerol esterified with acrylic acid (34.5 mol % of acrylic acid, 17.5 mol % of glycerol and 48.0 mol % of propanediol) containing on average 3 double bonds per molecule and having a double-bond equivalent weight of 160 and a number-average molecular weight of 480 (commercial product "OTA 480" from UCB Chemie GmbH, Drogenbos, Belgium) and 17.5 parts of a commercial, epoxide-containing reactive diluent having an epoxide equivalent weight of 120–130 and a Brookfield viscosity of 15 mPas at 25° C. (commercial product Cyracure® UVR 6200 from Union Carbide Corporation). Finally 2.5 parts of diethoxyacetophenone and 2.5 parts of a commercial cationic initiator (commercial product Degacure® KI85 B from Degussa AG; chemical name: bis [4-(diphenylsulfonio)-phenyl] sulfide bis-hexafluorophosphate) are added with stirring and the mixture is homogenized.

The coating composition 1 obtained in this way is applied to compact disks using a spin coater at a dry film thickness of 10 μm. The coating is cured using a UV irradiation unit equipped with two Hg medium-pressure radiators each with a lamp output of 80 W/cm. The irradiated dose here is 0.15 J/cm$^2$, measured using the UVICURE Dosimeter, System EIT from Eltosch. Immediately thereafter the adhesion to the metal surface and the scratch resistance is investigated by way of the fingernail scratch test. The test results are illustrated in Table 1.

In order to test their printability, the coated compact disks are first printed, directly after the curing of the protective coat, with a conventional, commercially available printing ink. When this was done, the printing inks exhibited a very good adhesion.

COMPARISON EXAMPLE 1

60 parts of the above-described polyester acrylate and 35 parts of the propoxylated glycerol esterified with acrylic acid and described in Example 1 (commercial product "OTA 480" from UCB Chemic GmbH) are homogenized with stirring. 5 parts of diethoxyacetophenone are then distributed homogeneously in the mixture by stirring. The coating composition 2 thus obtained is applied, analogously to Example 1, to compact disks with a dry film thickness of 10 μm and is cured analogously to Example 1 (irradiated dose 0.15 J/cm$^2$). The adhesion, scratch resistance, and printability are tested as in Example 1. The results are illustrated in Table 1.

COMPARISON EXAMPLE 2

30 parts of the above-described polyester acrylate, 30 parts of the cycloaliphatic epoxy resin described in Example 1 (commercial product Cyracure® UVR 6100 from Union Carbide Corporation), 17.5 parts of the propoxylated glycerol esterified with acrylic acid and described in Example 1 (commercial product "OTA 480" from UCB Chemie GmbH) and 17.5 parts of the epoxide-containing reactive diluent described in Example 1 (commercial product Cyracure® UVR 6200 from Union Carbide Corporation) are homogenized. 2.5 parts of diethoxyacetophenone and 2.5 parts of the cationic curing agent described in Example 1 (commercial product Degacure® KI85 from Degussa AG) are then added with stirring.

The coating composition 3 thus obtained is applied, analogously to Example 1, to compact disks with a dry film thickness of 10 μm and is cured analogously to Example 1 (irradiated dose 0.15 J/cm²). The adhesion, scratch resistance and printability are tested likewise in analogy to Example 1. The results are shown in Table 1.

TABLE 1

Test results

|  | Example 1 | Comparison Example 1 | Comparison Example 2 |
|---|---|---|---|
| Layer thickness μm | 10 | 10 | 10 |
| Fingernail test[1] | satisfactory | satisfactory | not satisfactory |
| Printability[2] | satisfactory | — | satisfactory |
| Adhesion to metal | satisfactory | not satisfactory | satisfactory |

1) An investigation is carried out as to whether the cured coating can be removed by scratching with the fingernail.

2) The cured coating is printed—as described in Example 1—with conventional printing inks. Subsequently the adhesion of the printing ink to the protective coat is assessed.

What is claimed is:

1. A radiation-curable coating composition, comprising:
   (A) from 20 to 50% by weight of at least one prepolymer containing at least two ethylenically unsaturated double bonds,
   (B) from 20 to 60% by weight of at least one cationically curing epoxy resin comprising a resin selected from the group consisting of bisphenol A epoxy resins, novolac epoxy reins, and cycloaliphatic epoxides,
   (C) from 10 to 30% by weight of at least one ketonic resin,
   (D) from 5 to 40% by weight of at least one reactive diluent, wherein the reactive diluent is different from the prepolymer (A),
and
   (E) from 5 to 10% by weight of a mixture of at least one cationic polymerization initiator and at least one free-radical polymerization initiator,
the sum of components A to E being 100% by weight.

2. A radiation-curable coating composition according to claim 1, wherein component A is selected from the group consisting of urethane acrylates, epoxy acrylates, polyester acrylates, and acrylic copolymers which contain acryloyl groups.

3. A radiation-curable coating composition according to claim 1, wherein component B comprises at least one cycloaliphatic epoxy resin.

4. A radiation-curable coating composition according to claim 1, wherein the ketonic resin employed as component C has a softening point of between 75° and 85° C.

5. A method of coating metallized surfaces, comprising the steps of applying a radiation-curable coating composition according to claim 1 onto a metallized surface and curing the applied coating by means of UV radiation or electron beams.

6. A method according to claim 5, wherein the surface is a metallized surface capable of carrying data of a data-storage device.

7. A method according to claim 6, wherein the surface is a metallized surface of a compact disk.

8. A data-storage device having a metallized surface coated with a coating composition according to claim 1.

9. A radiation-curable coating composition according to claim 2, wherein component B comprises at least one cycloaliphatic epoxy resin.

10. A radiation-curable coating composition according to claim 2, wherein the ketonic resin employed as component C has a softening point of between 75° and 85° C.

11. A radiation-curable coating composition according to claim 3, wherein the ketonic resin employed as component C has a softening point of between 75° and 85° C.

* * * * *